United States Patent [19]
Nauta

[11] Patent Number: 5,404,050
[45] Date of Patent: Apr. 4, 1995

[54] SINGLE-TO-DIFFERENTIAL CONVERTER

[75] Inventor: Bram Nauta, Eindhoven, Netherlands

[73] Assignee: U.S. Philips Corporation, New York, N.Y.

[21] Appl. No.: 164,184

[22] Filed: Dec. 9, 1993

[30] Foreign Application Priority Data

Dec. 11, 1992 [EP] European Pat. Off. ......... 92203839.3

[51] Int. Cl.$^6$ .................. H03K 17/693; H03K 17/62; H03F 3/16
[52] U.S. Cl. .................... 327/100; 330/301; 327/52; 327/171
[58] Field of Search ............. 330/301; 307/494, 261, 307/530, 608

[56] References Cited

U.S. PATENT DOCUMENTS

| | | | |
|---|---|---|---|
| 4,109,214 | 8/1978 | Main | 330/301 |
| 4,296,383 | 10/1981 | Jeandot et al. | 330/301 |
| 4,728,900 | 3/1988 | Nakagawara et al. | 307/530 |
| 4,845,675 | 7/1989 | Krenik et al. | 307/530 |
| 5,283,484 | 2/1994 | Brehmer et al. | 307/261 |

*Primary Examiner*—Timothy P. Callahan
*Assistant Examiner*—Terry L. Englund
*Attorney, Agent, or Firm*—Steven R. Biren

[57] ABSTRACT

A single-to-differential converter for generating two balanced output signals from one single-ended input signal includes first (3) and second (6) output terminals for providing the balanced output signal, a first transistor (M1) having a control electrode coupled to an input terminal (4) for receiving the input signal, a first main electrode coupled to a supply voltage terminal (1) for receiving a supply voltage and a second main electrode coupled to the first output terminal (3). A second transistor (M2) is provided having a control electrode coupled to a bias voltage terminal (5), a first main electrode coupled to the control electrode of the first transistor (M1) and a second main electrode connected to the second output terminal (6). A diode-connected third transistor (M3) is provided having its main current path coupled to the first output terminal (3), and a diode-connected fourth transistor (M4) is provided having its main current path connected to the second output terminal (6). The resulting single-to-differential converter provides low distortion and good balance at high frequencies.

5 Claims, 2 Drawing Sheets

SINGLE-TO-DIFFERENTIAL CONVERTER

BACKGROUND OF THE INVENTION

The invention relates to a single-to-differential converter for generating two balanced output signals from one single ended input signal.

In analog circuits, particularly in CMOS circuits, improvement of performance can be achieved by using a balanced architecture. If two signals are fully balanced, i.e. if the two signals have equal amplitude and an exact 180 degrees phase shift is present between the two signals, even non-linearities are strongly reduced in the circuits. Furthermore, in modem integrated systems mixed analog and digital signals are present and crosstalk from digital to analog parts of the system, e.g. by substrate bouncing, becomes a serious problem. A circuit with a balanced architecture is much less sensitive to crosstalk compared to a single ended equivalent. A further advantage of a balanced architecture is that signal inversion is simply achieved by cross-coupling two signals.

A general problem is the making of two balanced signals from one single ended signal having low distortion and good balancing at high frequencies. Commonly a simple differential pair structure is used having one input coupled to the single ended signal and the other input coupled to a fixed DC voltage. A problem in the differential pair is that the inverting and non-inverting output signals of the differential pair have unequal delays in respect of the input signal due to the capacitance present at the common node of the differential pair. This results in output signals having a phase difference unequal to 180 degrees.

SUMMARY OF THE INVENTION

It is an object of the invention to provide an accurate single-to-differential converter with low distortion and good balancing over a high frequency range. According to the invention a single-to-differential converter for generating two balanced output signals from one single ended input signal is provided, which is characterized in that the single-to-differential converter comprises:
  an input terminal for receiving the input signal;
  a first and a second output terminal for providing the balanced output signals;
  a supply voltage terminal for receiving a supply voltage;
  a first transistor having a control electrode coupled to the input terminal, a first main electrode coupled to the supply voltage terminal and a second main electrode coupled to the first output terminal;
  a bias voltage terminal for receiving a bias voltage;
  a second transistor having a control electrode coupled to the bias voltage terminal, a first main electrode coupled to the control electrode of the first transistor and a second main electrode coupled to the second output terminal;
  a third transistor having a first main electrode and a second main electrode, a main current path between the first main electrode and the se electrode and a control electrode coupled to the second main electrode, the main current path of the third transistor being connected to the first output terminal; and
  a fourth transistor having a first main electrode and a second main electrode, a main current path between the first main electrode and the second main electrode and a control electrode coupled to the second main electrode, the main current path of the fourth transistor being connected to the second output terminal.

In this single-to-differential converter the main current paths of the first and third transistors are operationally connected in series. A voltage increase at the control electrode of the first transistor causes for example a current increase in the series connection. The current increase causes a voltage increase across the diode-connected third transistor, so that the voltage increase at the control electrode of the first transistor is copied in the diode-connected third transistor. The main current paths of the second and fourth transistors are series connected too. However, the control electrode of the second transistor is grounded for signal changes and its first main electrode receives the input voltage. This arrangement results in a current decrease in the series connected second and fourth transistors in response to the voltage increase at the first main electrode of the second transistor. The current decrease causes a voltage decrease across the diode-connected fourth transistor which is equal to the voltage increase at the first main electrode of the second transistor. Since the control electrode of the first transistor and the first main electrode of the second transistor are both coupled to the same input terminal, a voltage change at the input terminal will cause equal, but opposite voltage changes at the first and second output terminals, which are connected to the diode-connected third and fourth transistors. The delay-match in the signal transfer from the input terminal to the first and second output terminals is disturbed only by the parasitic capacitance between the control electrode and the second main electrode of the first transistor. This capacitance causes a zero in the right half-plane of the transfer function from the input terminal to the first output terminal and gives rise to excess phase shift. Since this zero is located at very high frequencies the phase error can be kept small in the operating frequency range.

A first embodiment of the single-to-differential converter is characterized in that the single-to-differential converter further comprises a further supply voltage terminal for receiving a further supply voltage, the first main electrode of the third transistor being coupled to the second main electrode of the first transistor, the second main electrode and control electrode of the third transistor being coupled to the further supply voltage terminal, the first main electrode of the fourth transistor being coupled to the second main electrode of the second transistor and the second main electrode and control electrode of the fourth transistor being coupled to the further supply voltage terminal. The series arrangement of the first and the third transistors and the series arrangement of the second and the fourth transistors are connected between the first mentioned supply voltage terminal and the further supply voltage terminal. This embodiment needs a minimum number of transistors.

A second embodiment of the single-to-differential converter is characterized in that the single-to-differential converter further comprises:
  a first current mirror having a current input branch coupled to the second main electrode of the first transistor and a current output branch coupled to the first output terminal;

a second current mirror having a current input branch coupled to the second main electrode of the second transistor and a current output branch coupled to the second output terminal, the first main electrode of the third transistor being coupled to the supply voltage terminal, the second main electrode and control electrode of the third transistor being coupled to the first output terminal, the first main electrode of the fourth transistor being coupled to the supply voltage terminal and the second main electrode and control electrode of the fourth transistor being coupled to the second output terminal. In this embodiment the currents from the first and second transistors are folded back to the first mentioned supply voltage by means of the first and the second current mirrors. The advantage is the possibility of a lower supply voltage. Furthermore the common-mode level of the output signals is closer to the signal level of the input signal.

The input impedance at the input terminal is rather low, because the second transistor is driven at its first main electrode. To increase the input impedance further embodiments of the single-to-differential converter are characterized in that the single-to-differential converter further comprises a fifth transistor having a control electrode coupled to the input terminal, a first main electrode coupled to the supply voltage terminal and a second main electrode coupled to the control electrode of the first transistor. The fifth transistor in combination with the second transistor operates as a buffer amplifier and provides a high input impedance at the input terminal.

To provide the possibility of a current input signal, still further embodiments of the single-to-differential converter may be characterized in that the second main electrode of the fifth transistor is connected to the control electrode of the fifth transistor. The fifth transistor is now diode-connected and converts the input current to an input voltage.

BRIEF DESCRIPTION OF THE DRAWING

These and further aspects of the invention will be described in further detail with reference to the accompanying drawings, in which.

In these figures like reference symbols are employed to represent the same item.

DESCRIPTION OF THE PREFERRED EMBODIMENTS

Figure 1:
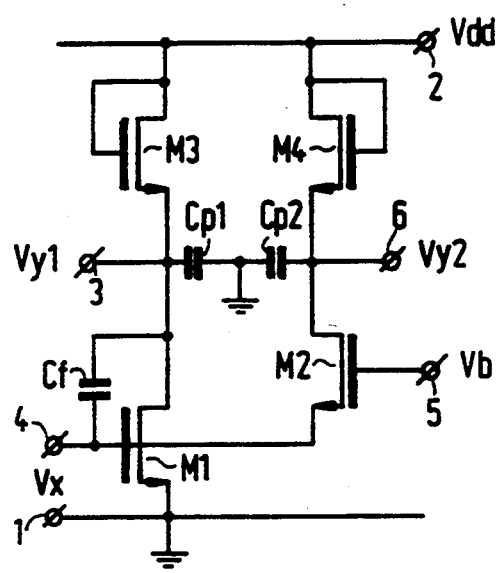
FIG. 1 shows a first embodiment of a single-to-differential converter in accordance with the invention.

FIG. 1 shows a circuit diagram of the basic principle of the single-to-differential converter according to the invention. The circuit employs NMOS transistors having a first main electrode or source, a second main electrode or drain and a control electrode or gate. The source of a first transistor M1 is connected to a supply voltage terminal 1 which in turn is connected to signal ground. The drain of transistor M1 is coupled via the main current path of a third transistor M3 to a further supply voltage terminal 2 to which a supply voltage Vdd can be connected which is positive with respect to ground. The gate and drain of the transistor M3 are interconnected and both connected to the further supply voltage terminal 2. The source of transistor M3 is connected to a first output terminal 3 and to the drain of transistor M1. The gate of transistor M1 is coupled to an input terminal 4 which receives the single ended input voltage Vx. The input terminal 4 is further coupled to the source of a second transistor M2, the gate of which is coupled to a bias voltage terminal 5 for receiving a bias voltage Vb, which is the sum of the gate-source voltages of the transistors M1 and M2. The drain of transistor M2 is coupled via the main current path of a fourth transistor M4 to the further supply voltage terminal 2. The gate and drain of transistor M4 are interconnected and both connected to the further supply voltage terminal 2. The source of transistor M4 is connected to a second output terminal 6 and to the drain of transistor M2. The transistors M1–M4 are assumed to be equal, but this is not necessary.

For low frequencies the circuit operates as follows. The gate-source voltage of transistor M1 is copied in transistor M3, because the transistors M1 and M3 are equal and the currents flowing through the transistors Mi and M3 are equal. The transfer of input voltage Vx at input terminal 4 to the first output terminal 3 is linear and inverting. So at the first output terminal 3 a voltage Vy1 is available which is inverted in respect of the input voltage Vx. In a similar way the gate-source voltage of transistor M2 is copied in the transistor M4. If Vx increases, the gate-source voltage of transistor M2 decreases with the same amount and this decrement is copied in transistor M4. Hence the transfer from the input terminal 4 to the second output terminal 6 is linear and non-inverting and at the second output terminal 6 a non-inverted output signal Vy2 is available.

For high frequencies the transfer from the input voltage Vx to the output voltage Vy1 has a pole due to the capacitance Cp1 present between the first output terminal 3 and ground. Equally, the transfer from the input voltage Vx to the output voltage Vy2 has a pole due to the capacitance Cp2 present between the second output terminal 6 and ground. However, due to the transistor matching, the poles in the transfers are well matched and the resulting phase shift is substantially equal for both output signals Vy1 and Vy2. The match in phase shift is disturbed by the gate-drain capacitance Cf of transistor MI. This capacitance causes a zero in the right-half plan in the transfer function from the input voltage Vx to the output voltage Vy1 and gives rise to excess phase shift. The zero can be designed at very high frequencies, for example at approximately 10 GHz, by using suitable high frequency transistors. In that case the phase error is small in the useful frequency range which can extend to several tens of MHz.

Figure 2:
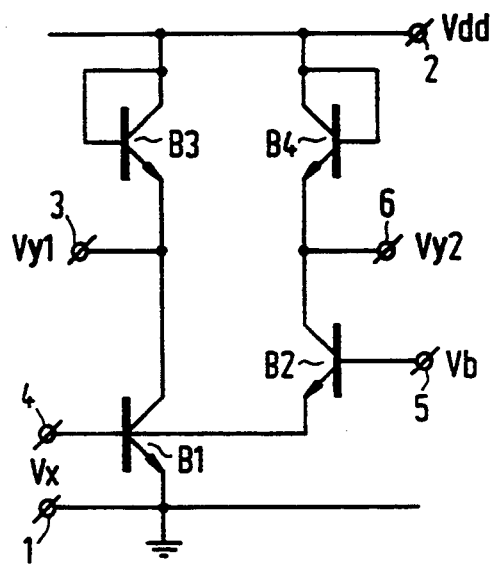
FIG. 2 shows a second embodiment of a single-to-differential converter in accordance with the invention.

In the single-to-differential converter also bipolar transistors may be employed as shown in FIG. 2. In that case the source, drain and gate of the MOS transistors M1–M4 should be replaced with the emitter, collector and base of the corresponding bipolar transistors B1–B4. Bipolar transistors may also be employed in the embodiments shown in the FIGS. 3 to 5.

Figure 3:
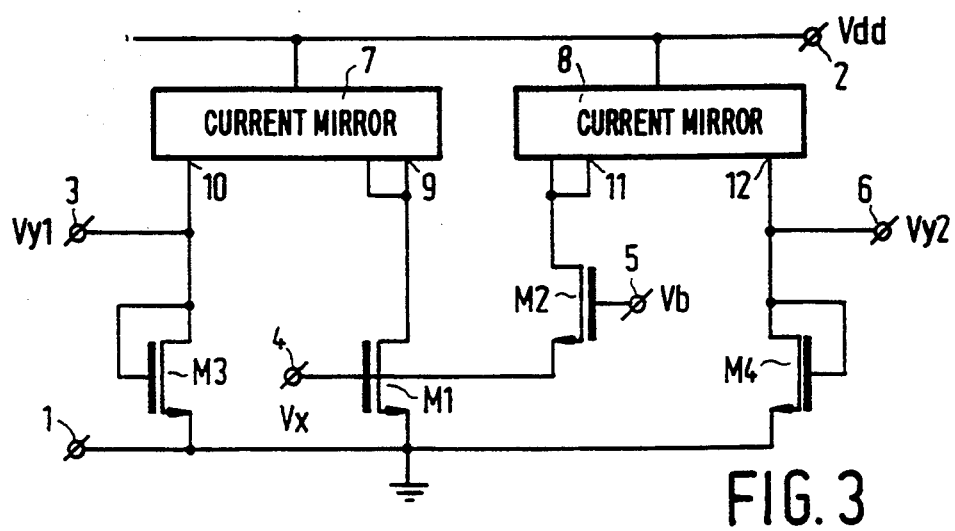
FIG. 3 shows a third embodiment of a single-to-differential converter in accordance with the invention.

FIG. 3 shows an embodiment in which current mirrors 7 and 8 are used to fold back the drain currents of the transistors M1 and M2 to the supply voltage terminal 1. To this end the input branch 9 of current mirror 7 is coupled to the drain of transistor M1 and the output branch 10 is coupled to the first output terminal 3. The interconnected gate and drain of transistor M3 are connected to the first output terminal 3 as well and the source of transistor M3 is connected to ground. In a similar way the drain of transistor M2 is coupled to the input branch 11 of current mirror 8, the output branch 12 of mirror 8 is connected to the second output terminal 6 and to the interconnected gate and drain of transistor M4 and the source of transistor M4 is connected to ground. The current mirrors 7 and 8 cause equal currents to flow in the transistors M1/M3 and the transistors M2/M4 respectively. The operational behaviour is the same as in the circuit of FIG. 1. The current mirrors 7 and 8 enable a lower supply voltage and a lower common-mode signal level in the output signals Vy1 and Vy2.

Figure 4:
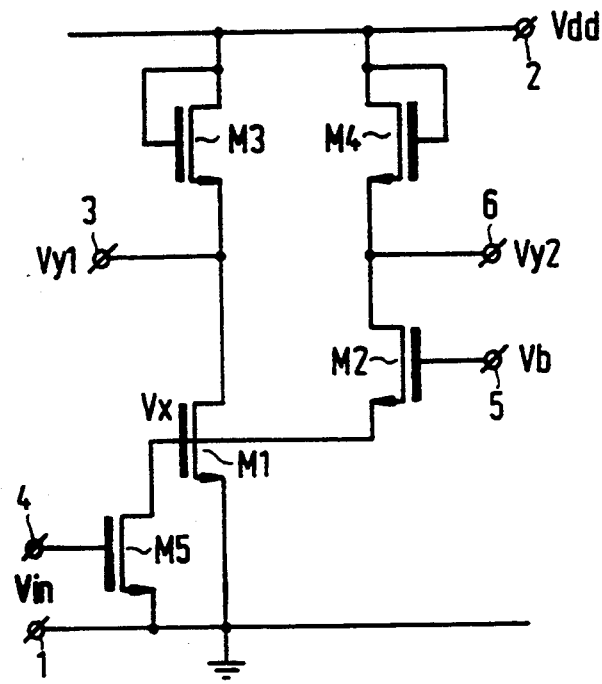
FIG. 4 shows a fourth embodiment of a single-to-differential converter / in accordance with the invention.

FIG. 4 shows a fifth transistor M5 with its gate, source and drain connected respectively to the input terminal 4, the supply voltage terminal 1 and the interconnected gate of transistor M1 and source of transistor M2. Transistor M5 provides a high input impedance at the input terminal 4. The voltage Vin at input terminal 4 is copied in the transistor M2 and provides a linear conversion from the input voltage Vin to the voltage Vx at the interconnected gate of transistor M1 and the source of transistor M2.

Figure 5:
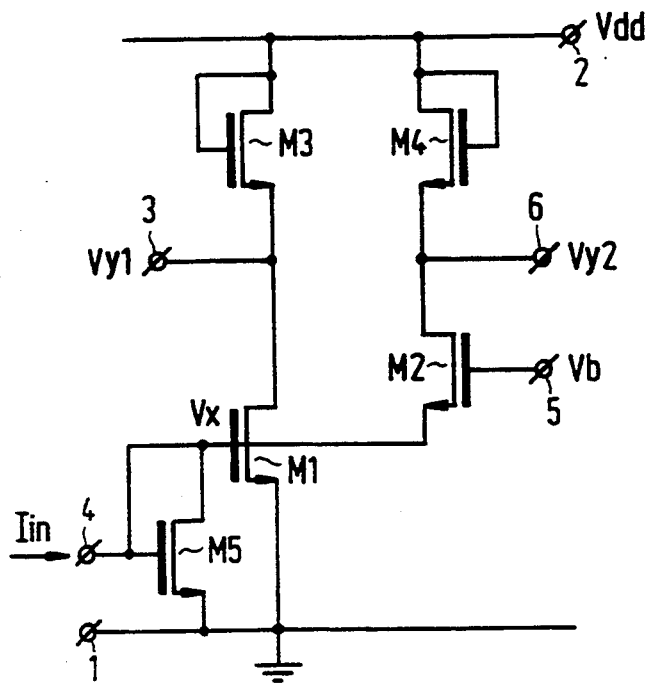
FIG. 5 shows a fifth embodiment of a single-to-differential converter in accordance with the invention.

FIG. 5 shows the same circuit of FIG. 4, but now the gate and drain of the fifth transistor M5 are interconnected to provide a current input at the input Iin terminal 4. For increasing voltage Vx at input terminal 4 the current in transistor M5 increases according to a square-law function and the current in transistor M2 decreases according to the same square law function. However, the current difference Iin between these two currents, which flows into the input terminal 4, increases linear. So the combination of the transistors M5 and M2 acts as a linear input resistance.

The additional transistor M5 as shown in the FIGS. 4 and 5 can also be employed in the embodiment of FIG. 3. It is further possible to scale the width-length ratio (W/L) between the transistors M1 and M3 and the transistors M2 and M4 to achieve amplification or attenuation in the output signals Vy1 and Vy2 in respect of the input signal Vx. The same effect can also be achieved in the embodiment of FIG. 3 by giving the current mirrors 7 and 8 an appropriate current mirroring factor. In all embodiments transistors of the opposite conductivity type (P-type) can be used as well. In that case the supply voltage at supply voltage terminal 2 should be negative in respect of the ground terminal 1.

I claim:

1. Single-to-differential converter for generating two balanced output signals from one single ended input signal, characterized in that the single-to-differential converter comprises:
   an input terminal (4) for receiving the input signal;
   a first (3) and a second (6) output terminal for providing the balanced output signals;
   a supply voltage terminal (1) for receiving a supply voltage;
   a first transistor (M1) having a control electrode coupled to the input terminal (4), a first main electrode coupled to the supply voltage terminal (1) and a second main electrode coupled to the first output terminal (3);
   a bias voltage terminal (5) for receiving a bias voltage;
   a second transistor (M2) having a control electrode coupled to the bias voltage terminal (5), a first main electrode coupled to the control electrode of the first transistor (M1) and a second main electrode coupled to the second output terminal (6);
   a third transistor (M3) having a first main electrode and a second main electrode, a main current path between the first main electrode and the second main electrode and a control electrode coupled to the second main electrode, the main current path of the third transistor (M3) being connected to the first output terminal (3); and
   a fourth transistor (M4) having a first main electrode and a second main electrode, a main current path between the first main electrode and the second main electrode and a control electrode coupled to the second main electrode, the main current path of the fourth transistor (M4) being connected to the second output terminal (6).

2. Single-to-differential converter as claimed in claim 1, characterized in that the single-to-differential converter further comprises a further supply voltage terminal (2) for receiving a further supply voltage, the first main electrode of the third transistor (M3) being coupled to the second main electrode of the first transistor (M1), the second main electrode and control electrode of the third transistor (M3) being coupled to the further supply voltage terminal (2), the first main electrode of the fourth transistor (M4) being coupled to the second main electrode of the second transistor (M2) and the second main electrode and control electrode of the fourth transistor (M4) being coupled to the further supply voltage terminal (2).

3. Single-to-differential converter as claimed in claim 1, characterized in that the single-to-differential converter further comprises:
   a first current mirror (7) having a current input branch (9) coupled to the second main electrode of the first transistor (M1) and a current output branch (10) coupled to the first output terminal (3); and
   a second current mirror (8) having a current input branch (11) coupled to the second main electrode of the second transistor (M2) and a current output branch (12) coupled to the second output terminal (6), the first main electrode of the third transistor (M3) being coupled to the supply voltage terminal (1), the second main electrode and control electrode of the third transistor (M3) being coupled to the first output terminal (3), the first main electrode of the fourth transistor (M4) being coupled to the supply voltage terminal (1) and the second main electrode and control electrode of the fourth transistor (M4) being coupled to the second output terminal (6).

4. Single-to-differential converter as claimed in claim 1, characterized in that the single-to-differential converter further comprises a fifth transistor (M5) having a control electrode coupled to the input terminal (4), a first main electrode coupled to the supply voltage terminal (1) and a second main electrode coupled to the control electrode of the first transistor (M1).

5. Single-to-differential converter as claimed in claim 4, characterized in that the second main electrode of the fifth transistor (M5) is connected to the control electrode of the fifth transistor (M5).

* * * * *